United States Patent [19]

Arnold

[11] 3,856,565

[45] Dec. 24, 1974

[54] METHOD OF ELECTROLESSLY PLATING A METAL TO A BODY WHICH INCLUDES LEAD

[75] Inventor: Anthony Francis Arnold, Ringoes, N.J.

[73] Assignee: RCA Corporation, New York, N.Y.

[22] Filed: Apr. 3, 1973

[21] Appl. No.: 355,671

[52] U.S. Cl. .................. 117/212, 117/47 R, 117/54, 117/123 B, 117/130 E, 117/160 R

[51] Int. Cl. .............................................. C23c 3/00

[58] Field of Search ........ 117/213, 212, 47 R, 71 R, 117/54, 124 C, 123 R, 130 E, 160 R; 204/19, 38 B; 65/3, 60; 106/1

[56] References Cited

UNITED STATES PATENTS

| | | | |
|---|---|---|---|
| 3,041,198 | 6/1962 | Certa | 117/50 |
| 3,305,389 | 2/1967 | Louenheim et al. | 106/1 |
| 3,423,226 | 1/1969 | Jensen | 117/47 R |
| 3,437,507 | 4/1969 | Jensen | 117/47 A |
| 3,689,292 | 9/1972 | Preston | 106/1 |

*Primary Examiner*—Charles E. Van Horn
*Assistant Examiner*—Michael W. Boll
*Attorney, Agent, or Firm*—G. H. Bruestle; W. S. Hill; P. J. Van Tricht

[57] ABSTRACT

The method includes the step of treating the surface of the body to be plated with an activating solution containing, in addition to the activating substance, a substance that reacts with lead ions to produce an insoluble lead compound.

4 Claims, No Drawings

METHOD OF ELECTROLESSLY PLATING A METAL TO A BODY WHICH INCLUDES LEAD

BACKGROUND OF THE INVENTION

Silicon semiconductor devices often have their electrode contact areas plated with nickel so that solder connections can be more readily made. The nickel is often deposited from an autocatalytic deposition bath. This method is usually referred to as "electroless" plating.

Since silicon is not a catalyst for the electroless deposition of nickel, the silicon surface is first treated with a solution that will deposit a thin film of a catalyst. The catalyst most often used is palladium metal. The silicon surface reduces some palladium salt in solution to palladium metal nuclei and these palladium nuclei deposit on the silicon surface. More palladium builds up around the nuclei.

It is customary to coat the non-electrode areas of a silicon semiconductor device with a protective passivating substance such as silicon dioxide or silicon nitride. For higher junction breakdown voltages, many devices now also have junctions covered with a layer of glass. A favored type of glass is one which is a combination of essentially PbO, $SiO_2$ and $Al_2O_3$.

The glass layer is deposited before the electrode areas are coated with nickel. Openings must be made through the glass layer where nickel is to be deposited. Catalytic palladium is then deposited on the exposed areas of silicon and the catalyzed areas are treated with an electroless nickel plating bath. Ordinarily, nickel readily deposits on a palladium-catalyzed surface and continues at a satisfactory rate. But when portions of the device are coated with a lead-containing glass, some of the lead apparently dissolves in the palladium solution and becomes deposited along with the palladium. Lead is a well known poison for the catalysis of oxidation-reduction reactions such as that involving reduction of a nickel salt with palladium. The presence of the lead inhibits the deposition of the nickel.

The present invention is an improved method in which a substance that reacts with lead ion to produce an insoluble lead compound is included in the palladium (or other catalyst) solution.

DESCRIPTION OF PREFERRED EMBODIMENT

As an example of the invention, it will be described in connection with depositing nickel on the electrode areas of a silicon semiconductor device which is coated with a lead-silica-alumina glass except where soldered connections are to be made.

After treating the silicon surface with a solution of hydrofluoric acid to remove any oxide that may have formed, the surface is treated with an aqueous solution capable of depositing a catalytic film. An example of such a solution is:

| | |
|---|---|
| $PdCl_2$ (5% by wt.) | 1.5 ml |
| Phosphoric acid (85% by wt. $H_3PO_4$) | 35 ml |
| Hydrofluoric acid (48% by wt. HF) | 20 ml |
| Wetting agent (propanol) | 100 ml |
| Deionized water | To make 1000 ml |

A preferred range of ingredients in the above composition is:

| | | |
|---|---|---|
| 5% $PdCl_2$ | 1–2 ml | These amounts are per liter of aqueous solution |
| 85% $H_3PO_4$ | 20–50 ml | |
| 48% HF | 1–20 ml | |

The amount of wetting agent varies greatly depending on the one that is used. For example, if one such as "Macrowet No. 2" is used, the amount is only about 3 ml.

If the body on which the metal is being deposited, contains no silicon dioxide, the HF can be omitted entirely. Also, it is not always essential that a wetting agent be present.

This solution is at room temperature and is permitted to remain in contact with the device for 3 minutes. In this solution, the phosphoric acid is the ingredient that reacts with any lead ion that may be present to produce insoluble lead phosphate. The HF is for the purpose of dissolving any silicon dioxide that may be present on the silicon surface. The wetting agent is for the purpose of ensuring that the solution wets the silicon surface and thus prevents the palladium nuclei from being moved around on the surface and accumulating in some spots while being absent in others. Non-uniformity often results when the palladium coated surface is moved in and out of rinsing baths and plating bath if the palladium-coated surface becomes dewetted. Non-uniformity of the palladium film leads to non-uniformity of the later deposited nickel.

Any soluble phosphate (except ammonium) may be used in place of phosphoric acid to react with the lead ions. Examples are all alkali metal phosphates. Less satisfactorily, sulfuric acid or other soluble sulfate may be used for this purpose. However, lead sulfate, which is formed in the reaction, is somewhat more soluble that lead phosphate.

Although nickel has been given as an example of the metal which is electrolessly deposited, other metals such as copper and cobalt can also be plated out.

The activator also does not need to be palladium. Other activators such as platinum can be used.

The surface being plated does not need to be silicon. It can be another semiconductor, such as germanium, or another type of surface such as a metal or an insulator. If the surface is one which does not reduce a palladium (or other activator) salt to metal, the surface must first be treated with a sensitizer such as stannous chloride.

The lead which is to be protected against may also be incorporated in something other than a glass protective layer. For example, it may be in a solder which is part of the device being treated, or in the environment in some other form, such as the walls of the container in which the treatment is taking place.

I claim:

1. In a method of depositing a metal electrolessly from a plating bath, on a surface of a body a portion of which surface contains a lead compound, the step of activating said surface with a solution separate from the plating bath, that includes, in addition to the activating substance, a substance that reacts with lead ions to form an insoluble lead compound such that the lead is converted to a condition in which it cannot poison said activating substance.

2. A method according to claim 1 in which said body is made of silicon which is partially coated with a glass containing said lead compound.

3. A method according to claim 2 in which said activating substance is palladium.

4. A method according to claim 3 in which said substance that reacts with lead ions is a phosphate.

* * * * *